(12) United States Patent
Dory

(10) Patent No.: US 7,550,841 B2
(45) Date of Patent: Jun. 23, 2009

(54) METHODS OF FORMING A DIAMOND MICRO-CHANNEL STRUCTURE AND RESULTING DEVICES

(75) Inventor: Thomas S. Dory, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 453 days.

(21) Appl. No.: 11/388,078

(22) Filed: Mar. 23, 2006

(65) Prior Publication Data

US 2007/0224727 A1    Sep. 27, 2007

(51) Int. Cl.
*H01L 23/34* (2006.01)
(52) U.S. Cl. .................................................. 257/722
(58) Field of Classification Search ................ 257/675, 257/706, 720, 722; 438/122, 584
See application file for complete search history.

(56) References Cited

U.S. PATENT DOCUMENTS

| | | | |
|---|---|---|---|
| 5,124,179 A | 6/1992 | Garg et al. | |
| 5,126,206 A | 6/1992 | Garg et al. | |
| 5,642,779 A * | 7/1997 | Yamamoto et al. | 165/185 |
| 6,521,149 B1 | 2/2003 | Mearini et al. | |
| 6,784,113 B2 * | 8/2004 | Hembree | 438/759 |
| 6,919,231 B1 | 7/2005 | Ramanathan et al. | |
| 7,109,581 B2 * | 9/2006 | Dangelo et al. | 257/720 |

2003/0183368 A1 * 10/2003 Paradis et al. .............. 165/80.3

FOREIGN PATENT DOCUMENTS

CN        1365169 A        8/2002

OTHER PUBLICATIONS

University of Bristol, United Kingdom, CVD Diamond Film Group, "Patterning of CVD Diamond Films", Oct. 4, 2005, 1 page.
University of Bristol, United Kingdom, CVD Diamond Film Group, "Low Temperature Diamond CVD using CO2/CH4 Gas" Oct. 4, 2005, 3 pages.
Oxford Lasers Ltd., Oxford Lasers Industrial Division, "High Precision CVL Micro-Drilling", Case Study B6, Abingdon Oxon, United Kingdom, 1 page, 2005.
M. Ashfold et al., "Thin Film Diamond by Chemical Vapour Deposition Methods", Chem. Soc. Rev.,1994, vol. 23, Issue 1, pp. 21-30.
M. Ashfold et al., "Diamond Chemical Vapour Deposition", Chemistry and Industry, Jul. 7, 1997, Society of Chemical Industry (UK), 5 pages.
Office Action Received for Chinese Patent Application No. 200710089377.9, mailed Nov. 21, 2008 4 pages of office action and 3 pages of English translation.

* cited by examiner

*Primary Examiner*—Calvin Lee
(74) *Attorney, Agent, or Firm*—Kerry Tweet

(57) ABSTRACT

A diamond micro-channel structure disposed on a die, as well as methods of forming the same, are disclosed. One or more walls of each channel may comprise diamond (or other diamond-like material). The micro-channel structure may form part of a fluid cooling system for the die. Other embodiments are described and claimed.

12 Claims, 10 Drawing Sheets

METHODS OF FORMING A DIAMOND MICRO-CHANNEL STRUCTURE AND RESULTING DEVICES

FIELD OF THE INVENTION

The disclosed embodiments relate generally to the cooling of integrated circuit devices and, more particularly, to methods of forming a diamond micro-channel structure, as well as to cooling systems and devices including such a structure.

BACKGROUND OF THE INVENTION

As the performance and functionality of integrated circuit devices improves with each design generation, semiconductor device manufacturers are facing a corresponding increase in power consumption of these devices. Thus, future generations of integrated circuit devices—including, for example, multi-core architectures—may place greater demands upon the cooling solution and, therefore, may require thermal solutions that provide greater heat dissipation. Thermal solutions that have been proposed for current and future generations of integrated circuit devices include liquid cooling solutions, as well as others. A liquid cooling system for an integrated circuit die may comprise one or more small channels (e.g., micro-channels) placed in proximity to the die, and a fluid may flow through these channels to remove heat from the die.

DETAILED DESCRIPTION OF THE INVENTION

Figure 1:
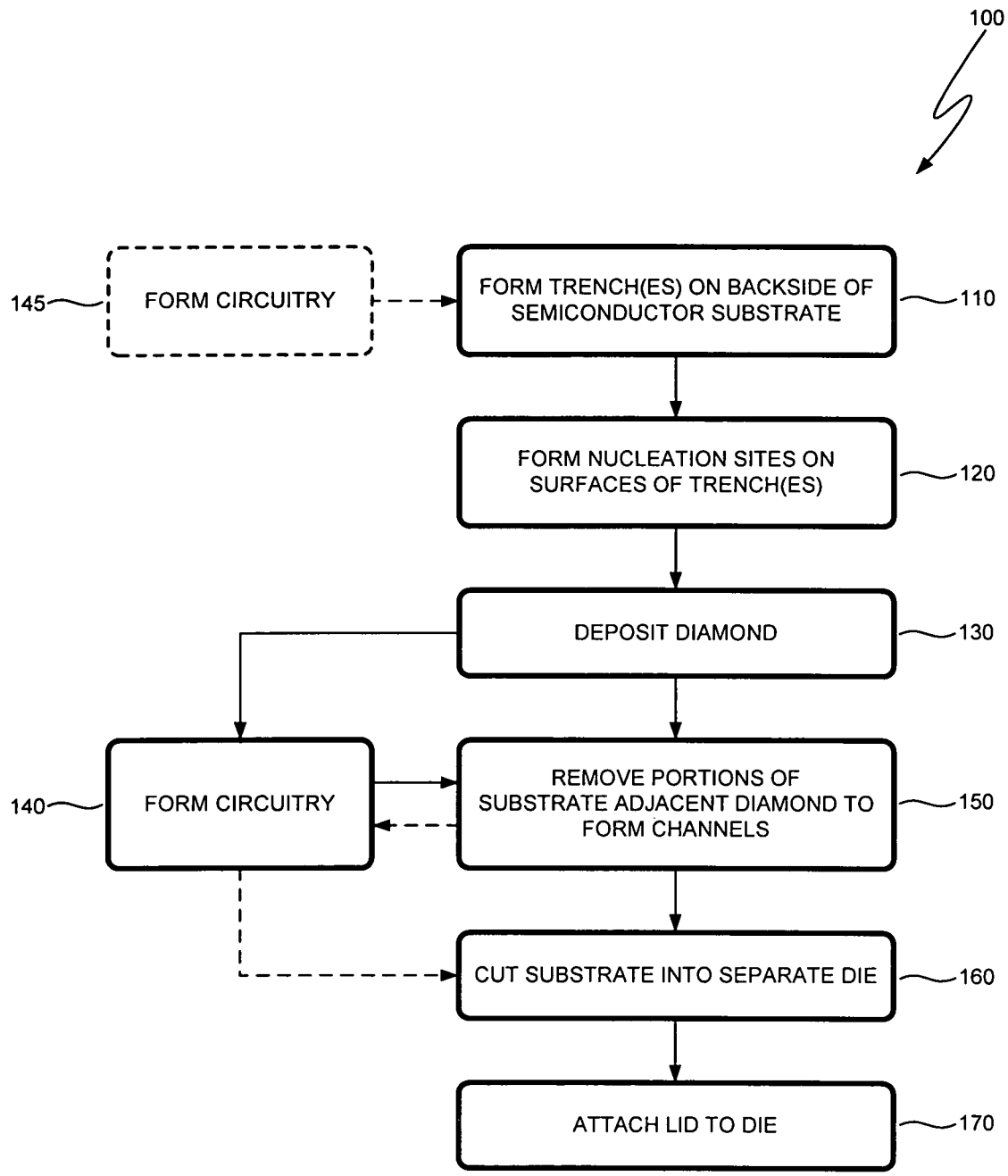
FIG. 1 is a block diagram illustrating embodiments of a method for forming a diamond micro-channel structure.

Turning now to FIG. 1, illustrated are embodiments of a method 100 of forming a diamond micro-channel structure. Embodiments of the method 100 shown in FIG. 1 are further illustrated in the schematic diagrams of FIGS. 2A through 2I, and reference should be made to these figures as called out in the text below.

Figure 2A:
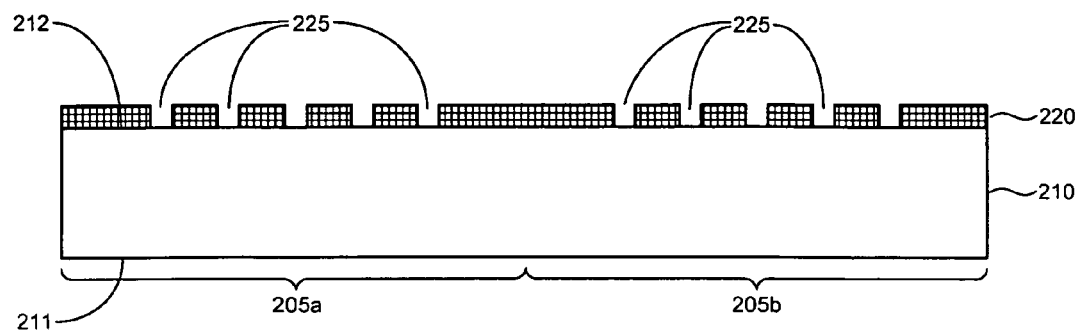
FIGS. 2A-2I are schematic diagrams illustrating embodiments of the method shown in FIG. 1.
Figure 2B:
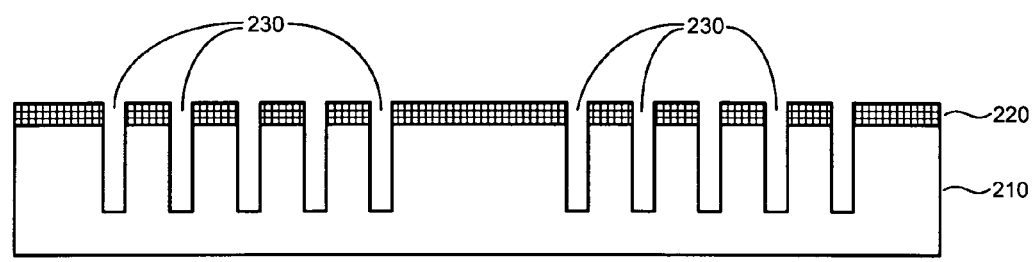

Referring to block 110 in FIG. 1, one or more trenches are formed on the back side of a semiconductor substrate. This is illustrated in FIGS. 2A and 2B. Turning first to FIG. 2A, a substrate 210 is provided. The substrate 210 may be viewed as having a front side 211 and art opposing back side 212. It should be understood, however, that the labels "front side" and "back side" are arbitrary and, further, that the various surfaces of the substrate 210 may be referenced by any suitable convention. In one embodiment, the substrate 210 comprises a semiconductor wafer upon which integrated circuitry for a number of die is to be (or has been) formed. For example, as shown in FIGS. 2A-2I, the substrate 210 includes die 205a and 205b. The semiconductor wafer may comprise any suitable material, such as silicon, silicon-on-insulator (SOI), gallium arsenide (GaAs), or other material or combination of materials. According to one embodiment, the substrate has a thickness up to 600 µm.

For ease of illustration, the substrate 210 shown in FIGS. 2A through 2G includes a limited number of die 205a, 205b (as well as a limited number of diamond channel structures that are to be formed, as described below). However, it should be understood that the disclosed embodiments are typically performed at the wafer level and that such a wafer may include integrated circuitry for any suitable number of die. This is further illustrated in FIG. 3 which shows a plan view of a wafer 300. Referring to this figure, the wafer 300 comprises a substrate 310 upon which integrated circuitry for a number of die 305 will be (or has been) formed, and wafer 300 is ultimately cut into these separate die 305. In one embodiment, the substrate 310 includes a number of diamond channel structures formed thereon, as will be described below. In practice, each die 305 may include hundreds of millions of circuit elements (e.g., transistors, etc.), and each of the die 305 may also include any desired number and pattern of diamond channel structures.

With continued reference to FIG. 2A, in one embodiment, trenches are formed by first depositing a layer of photoresist 220 over the back side 212 of substrate 210. The photoresist layer 220 is then patterned to form a mask having openings 225, as shown in FIG. 2A. Referring now to FIG. 2B, an etching process is performed to create trenches 230, which are formed at locations defined by mask openings 225. Any suitable etching technique (or combination of etching processes) may be employed to create trenches 230. By way of example, trenches 230 may be formed using a plasma etching process or a deep reactive ion etching process (DRIE). In one embodiment, the trenches have a depth of up to 500 µm and a width of up to 100 µm.

Returning to FIG. 1, nucleation sites are formed on the surfaces of the trenches, as set forth in block 120. Generally, a nucleation site comprises any region on a surface of a trench at which a quantity of diamond can be grown or deposited. It should be understood, however, that a nucleation site may comprise a region from which a quantity of another material—e.g., diamond-like carbon or other diamond-like material—may be grown or otherwise deposited. In essence, the nucleation sites may provide a seed layer for diamond growth. According to one embodiment, diamond will be selectively grown within the trenches 230, and nucleation site formation is limited to the surfaces 235 of trenches 230. However, it should be understood that, in some embodiments diamond growth may not be selective, and in other embodiments nucleation sites may be formed on other surfaces of substrate 210.

Figure 2C:
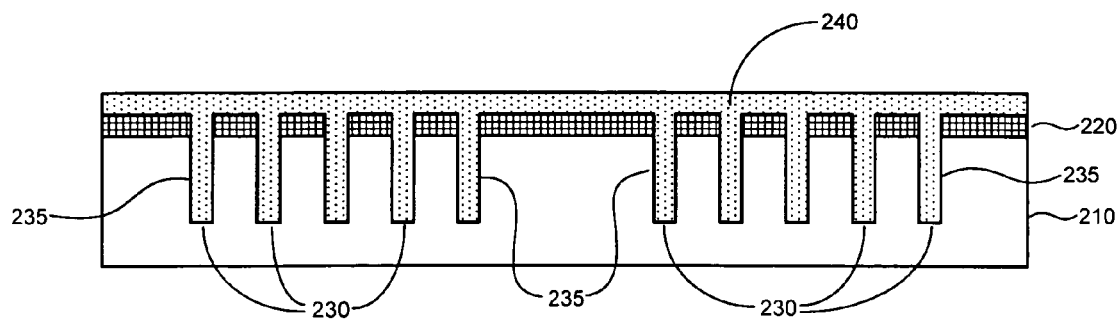
Figure 3:
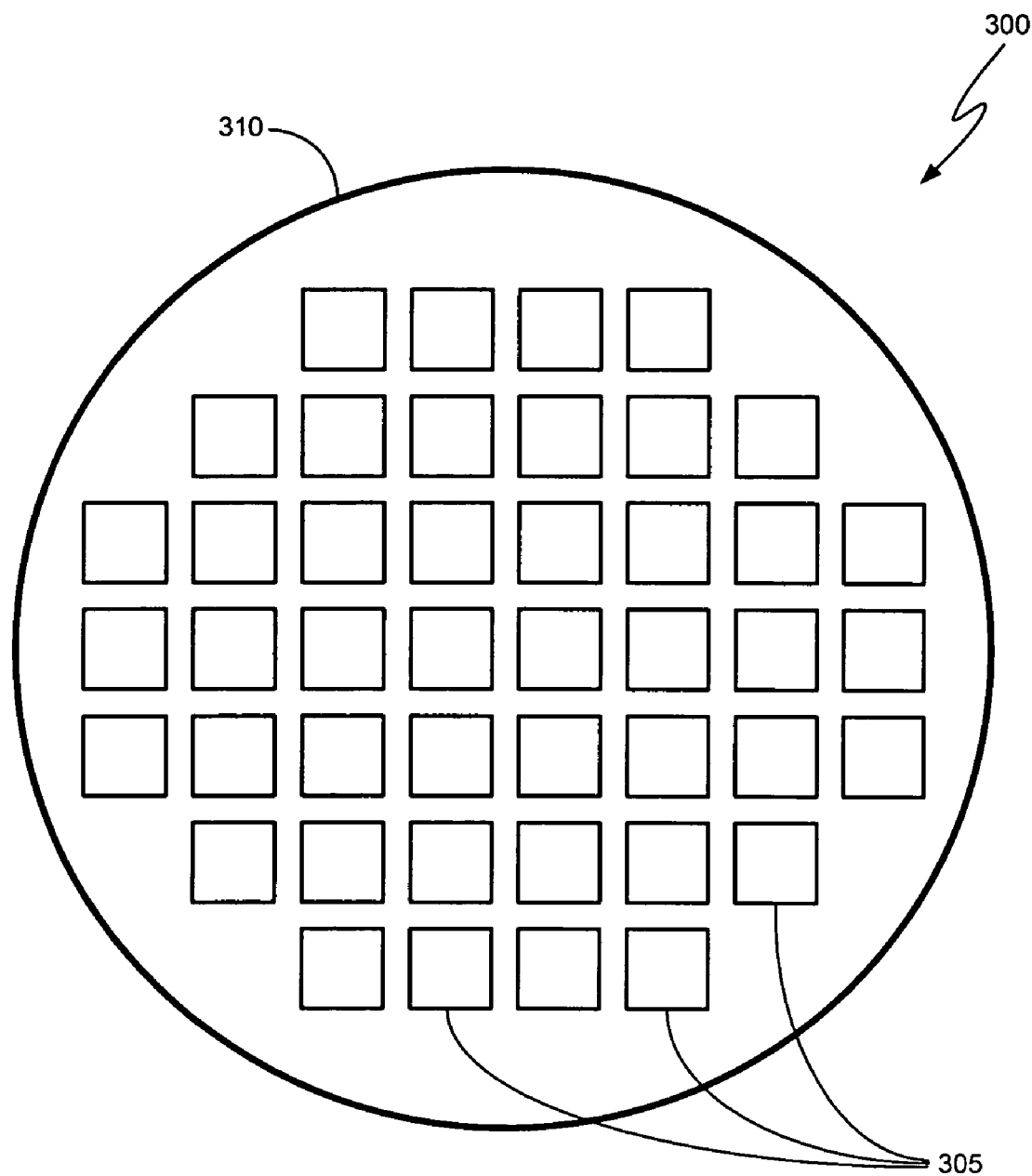
FIG. 3 is a schematic diagram illustrating an embodiment of a wafer which may be formed according to the disclosed embodiments.
Figure 4:
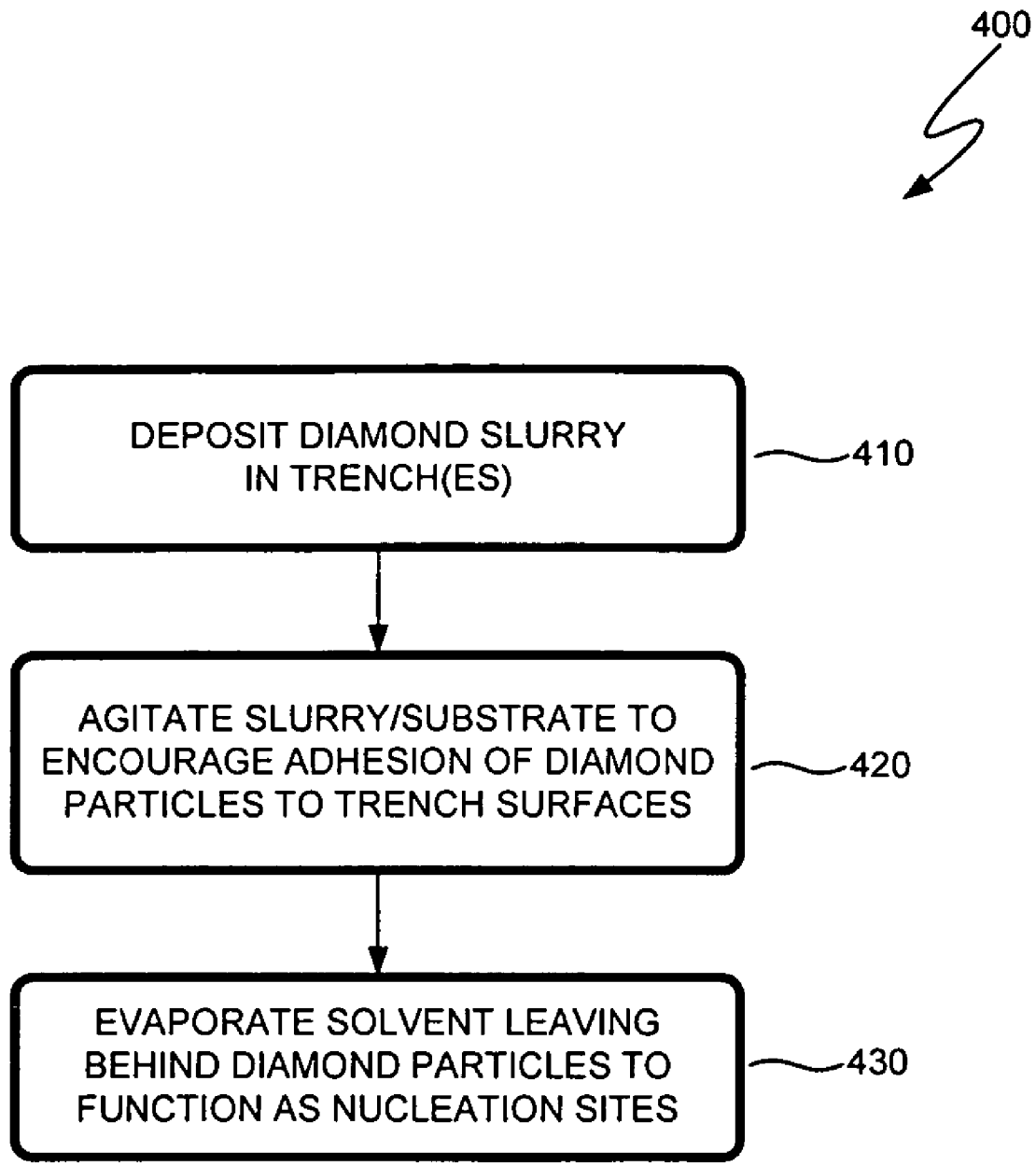
FIG. 4 is a block diagram illustrating an embodiment of a method for forming nucleation sites for diamond growth.

Any suitable technique may be employed to provide nucleation sites on the surfaces 235 of the trenches 230. In one embodiment, diamond nucleation sites are formed using a slurry containing diamond particles. This is illustrated in FIG. 2C in conjunction with FIG. 4. Referring to block 410 in FIG. 4, a diamond slurry is deposited in the trenches 230 (and perhaps over other surfaces of substrate 210). This is illustrated in FIG. 2C, where a slurry 240 has been disposed in trenches 230 (and over other surfaces of substrate 210). According to one embodiment, the slurry comprises a solvent, diamond particles, and a surfactant (e.g., to promote wetting). Any suitable solvent may be used, and in one embodiment the solvent comprises water. In one embodiment, the diamond particles may have sizes ranging from 0.05 µm to 10 µm, and the content of diamond particles may comprise up to 50 percent by volume of the slurry. As set forth in block 420, the slurry (and substrate) is agitated to encourage adhesion of diamond particles to the trench surfaces. In one embodiment, agitation is created by inducing ultrasonic vibrations in the slurry 240 (and substrate 210). Then, as set forth in block 430, the solvent is evaporated, leaving behind diamond particles deposited on the surfaces 235 of trenches 230, these diamond particles providing nucleation sites for diamond growth. Evaporation of the solvent may be achieved by exposing the slurry to heat, dry air, and/or a vacuum environment.

In another embodiment, nucleation sites may be created by roughening the surfaces 235 of the trenches 230 (or at least portions of these surfaces). The surface features on such a roughened surface (e.g., small peaks and valleys, as well as other surface defects) can serve as nucleation sites for the growth of diamond. In one embodiment, the trench surfaces 235 are roughened using a deep reactive ion etching (DRIE) process. Thus, where the trenches 230 are formed using the DRIE process, the desired surface roughness may be a natural outcome of trench formation. However, where alternative etching techniques are used to form trenches 230, a subsequent DRIE process (in addition to the initial etch for trench formation) may be carried out to provide the desired surface roughness. According to one embodiment, the roughened trench surfaces 235 have feature sizes ranging from 10 nm to 600 nm.

Figure 2D:
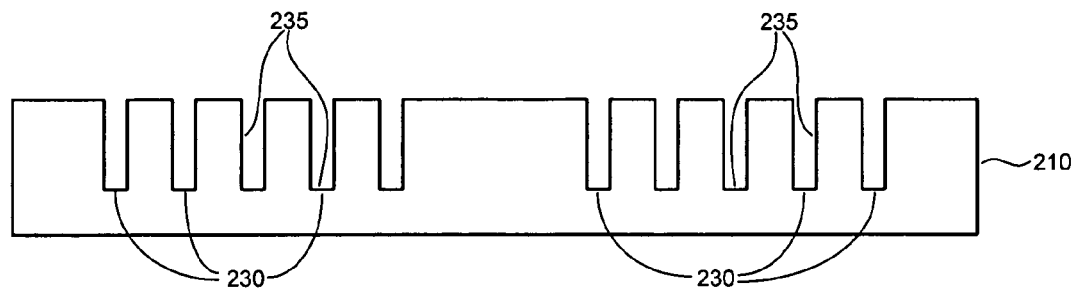

Although the use of a diamond slurry or the creation of a roughened surface are described above, it should be understood that the disclosed embodiments are not limited to these methods for nucleation site formation and, further, that other alternative methods may be employed. However, irrespective of the manner in which nucleation sites (or other seed layer) are formed, the result is a number of nucleation sites distributed over the surfaces 235 of trenches 230 (see FIG. 2D). In addition, prior to diamond growth, any remaining photoresist (e.g., photoresist layer 220) may be removed from the substrate 210, as is also shown in FIG. 2D.

Figure 2E:
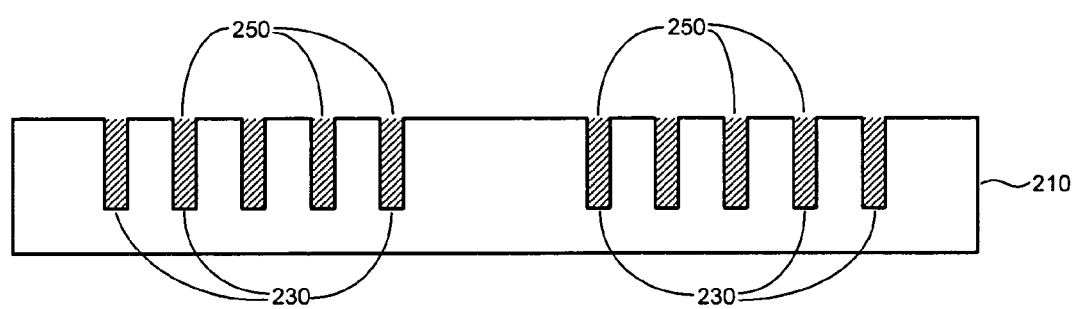

Returning again to FIG. 1, diamond (or other diamond-like material) is deposited in the trenches, as set forth in block 130. This is illustrated in FIG. 2E, where diamond 250 has been grown in each of the trenches 230. According to one embodiment, the diamond 250 is grown using a chemical vapor deposition (CVD) process, wherein the previously formed nucleation sites serve as a seed layer for CVD diamond growth. In one embodiment, diamond CVD growth is performed using a precursor comprising a mixture of methane and hydrogen or a mixture of acetylene ($C_2H_2$) and hydrogen, with methane (or acetylene) comprising between approximately 1 and 2.5 percent of the mixture. Diamond CVD growth may occur with the gas precursor mixture being introduced at a flow of between 50 and 200 standard cubic centimeters per minute (sccm), at a temperature between 700-800 degrees Celsius, and at a pressure of between 10 and 300 Torr. According to another embodiment, a plasma enhanced CVD process is used for diamond growth. Plasma enhanced CVD deposition may be achieved at a frequency of approximately 2.43 GHz, at a power of approximately 1000 W, at a temperature of between 700-900 degrees Celsius, and at a pressure between 1 and 100 Torr. However, it should be understood that the above are but a few examples of the process parameters that may be employed for the CVD growth of diamond and, further, that any other suitable process parameters may be used depending upon the desired characteristics of the diamond structures that are being formed. Also, it should be understood that the disclosed embodiments are not limited to CVD diamond growth, and that other methods of depositing diamond (or other diamond-like materials, such as diamond-like carbon) may be employed.

Figure 2F:
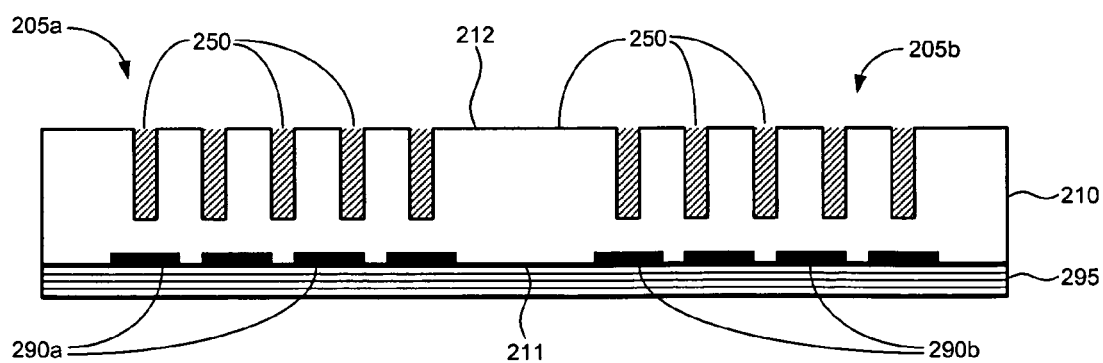

In one embodiment, as set forth in block 140 of FIG. 1, circuitry is then formed on the substrate. This is illustrated in FIG. 2F, where circuitry 290*a*, 290*b* (for die 205*a*, 205*b*, respectively) has been formed on the front side 211 of substrate 210. Circuitry 290*a*, 290*b* may comprise a collection of circuit elements, including transistors, capacitors, resistors, diodes, inductors, etc. Although, a limited number of circuit elements have been shown in the figures for ease of illustration, it should be understood that in practice, each of the die 205*a*, 205*b* may include hundreds of millions of transistors and other circuit elements.

Also, as shown in FIG. 2F, an interconnect structure 295 may be formed over the front side 211 (and over the active circuitry 290*a*, 290*b*). This interconnect structure 295 may include a number of levels of metallization, each level of metallization comprising a layer of dielectric material in which a number of conductors (e.g., traces) has been formed. The conductors in any given level of metallization are separated from the conductors of adjacent levels by the dielectric material, and the conductors of adjacent levels are electrically interconnected by conductive vias extending between these levels. The conductors and vias may comprise any suitable conductive material, such as copper, aluminum, gold, silver, or alloys of these and other metals. The dielectric material may comprise any suitable dielectric or insulating material, such as silicon dioxide ($SiO_2$), SiOF, carbon-doped oxide (CDO), a glass, or a polymer material.

Formation of integrated circuitry after diamond growth may be desired where the temperatures at which diamond growth takes place (e.g., up to 800 degrees Celsius) exceeds the thermal budget for the integrated circuitry (e.g., up to 450 degrees Celsius). However, in some embodiments, a lower temperature diamond growth process—e.g., less than the thermal budget associated with integrated circuitry—may be employed (e.g., a low temperature CVD diamond growth process). Thus, in another embodiment, should diamond growth take place at temperatures that do not exceed the integrated circuit thermal budget, formation of circuitry may take place prior to trench formation and diamond growth, as illustrated by block 145 in FIG. 1.

Figure 2G:
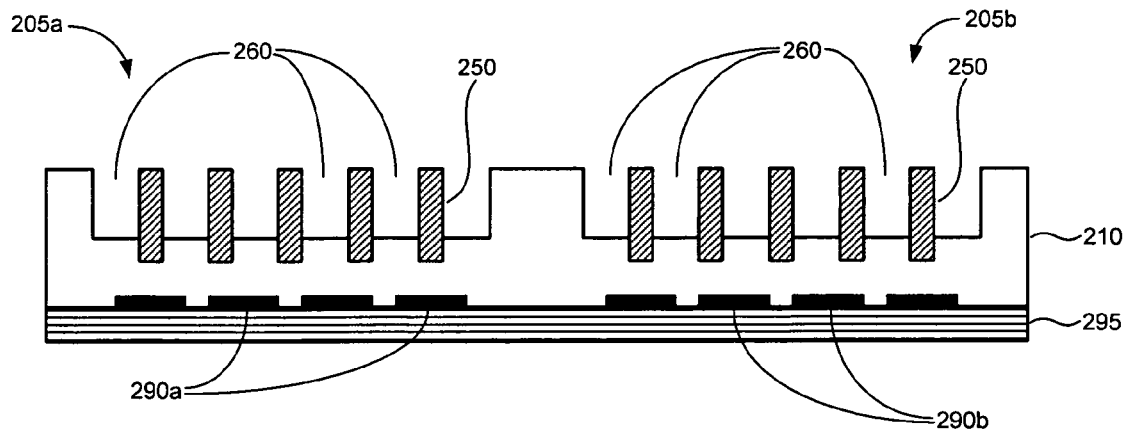

Referring now to block 150 in FIG. 1, portions of the substrate adjacent the diamond structures are removed to form channels. This is illustrated in FIG. 2G, where portions of the substrate 210 have been removed to form channels 260. The previously formed diamond structures 250 form one or more walls (e.g., at least one sidewall) of the channels 260, with the substrate 210 also providing one or more walls of the channels (e.g., the bottom wall of each channel and, perhaps, a sidewall of a channel). Any suitable process, such as a wet etching process, may be employed to remove portions of the substrate 210. According to one embodiment, as shown FIG. 2G, the depth of the etch is less than the heights of the diamond structures 250, such that a portion of the diamond structures 250 remains embedded in the substrate 210. In one embodiment, between 20-30 percent of the diamond structures extends into the substrate 210. Leaving a portion of the diamond structures 250 embedded in the substrate may provide a number of advantages, including improved adhesion of the diamond to the underlying substrate 210 and enhanced thermal performance.

In one embodiment, the channels 260 are arranged in a pattern forming part of a fluid cooling system for an integrated circuit die. Diamond has a high thermal conductivity (e.g., 2,000 W/mK), as well as a low thermal expansion coefficient (e.g., 0.8 ppm/K). Thus, a fluid cooling system disposed on one side of a die that includes channels comprised, at least in part, of diamond (or another diamond-like material)—and having diamond walls embedded in the die substrate—may be efficient at removing heat from circuitry located on an opposing side of the die. In one embodiment, the channels 260 have height and width dimensions that range from tens of microns to hundreds of microns, and these channels may be referred to as "micro-channels." However, it should be understood that structures may be formed according to the disclosed embodiments having any suitable dimensions.

Figure 5A:
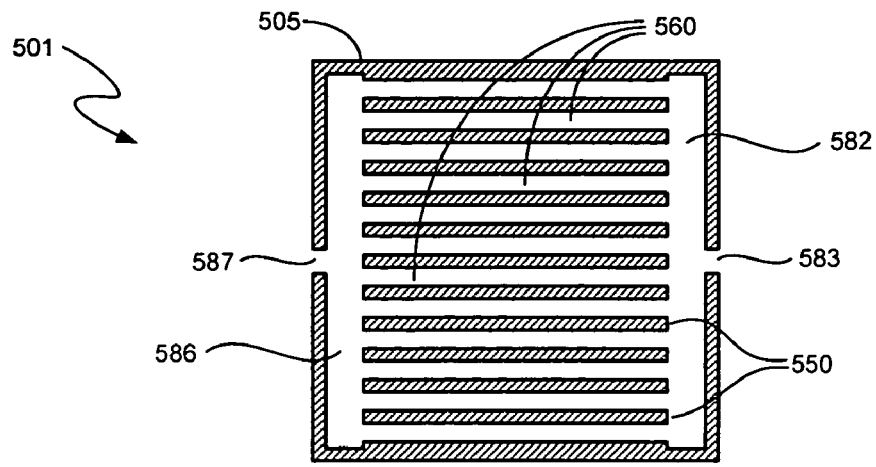
FIGS. 5A-5C are schematic diagrams, each illustrating an embodiment of a pattern of channels formed according to the disclosed embodiments.
Figure 5B:
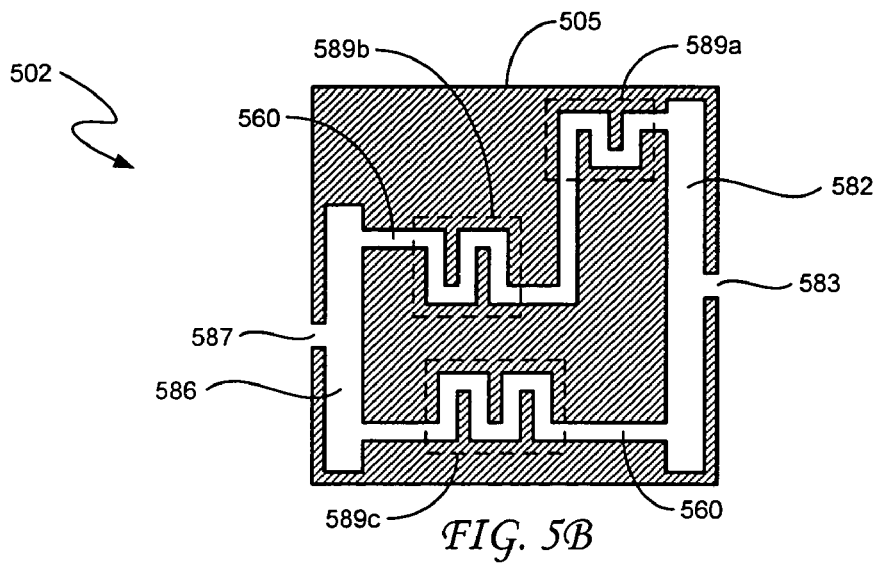
Figure 5C:
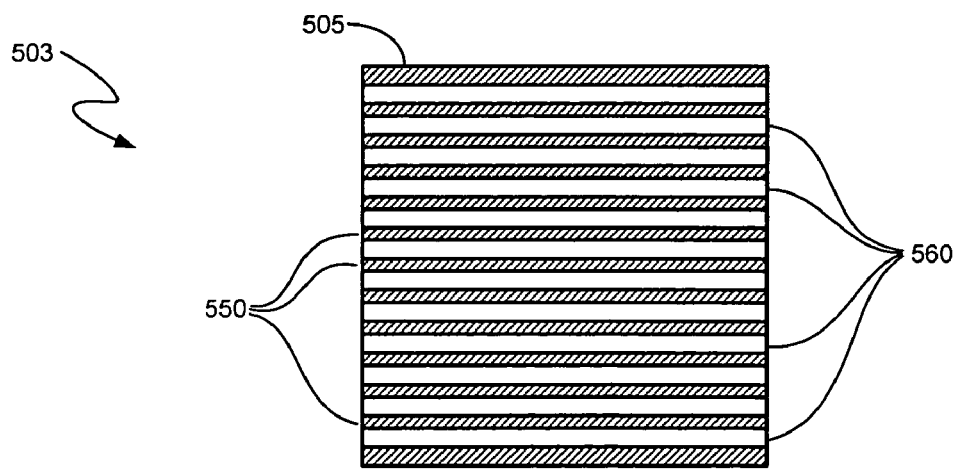

The pattern of channels 260 may have any suitable arrangement, and some examples are shown in FIGS. 5A through 5C. Turning first to FIG. 5A, a pattern 501 on a die 505 includes a number of channels 560 (separated by diamond structures 550) extending between an inlet fluid reservoir 582 and a outlet fluid reservoir 586. The inlet reservoir 582 includes a fluid inlet 583, and the outlet reservoir 586 includes a fluid outlet 587. Fluid may be introduced into inlet reservoir 582 through inlet 583, flow through the channels 560 and across the die 505 (thereby removing heat generated by circuitry on the die), and enter the outlet reservoir 586. Fluid may then be removed through the outlet 587 and perhaps recirculated through a closed-loop fluid cooling system, as will be described below.

In the embodiment of FIG. 5A, the pattern 501 of channels 560 covers a substantial portion of the die 505. However, in other embodiments, channels may extend over specific portions of a die, such as "hot spots" on the die, wherein other portions of the die may not have channels, and an example of such an embodiment is shown in FIG. 5B. Referring to FIG. 5B, a pattern 502 of channels on a die 505 includes an inlet fluid reservoir 582 having an inlet 583 and an outlet fluid reservoir 586 having an outlet 587. Extending between the inlet and outlet reservoirs 582, 586 are channels 560 (wherein at least portions of the walls of channels 560 comprise diamond structures). However, the channels 560 traverse portions of the die 505 corresponding to "hot spots" 589a, 589b, and 589c, while other portions of the die 505 do not have channels.

In the embodiments of FIGS. 5A and 5B, the patterns of channels disposed on the die included fluid inlet and outlet reservoirs. However, in other embodiments, fluid inlet and outlet reservoirs (as well as a fluid inlet and outlet) may be disposed on another component (e.g., a lid, an integrated heat spreader, etc.) and, therefore, these elements may not be formed on the die. Such an embodiment is illustrated, by way of example, in FIG. 5C. Referring to FIG. 5C, a pattern 503 of channels on a die 505 comprises a number of channels 560 (separated by diamond structures 550) extending across the die. The channels 560 extend substantially the length of the die, and the pattern of channels does not include inlet and outlet fluid reservoirs.

Figure 2H:
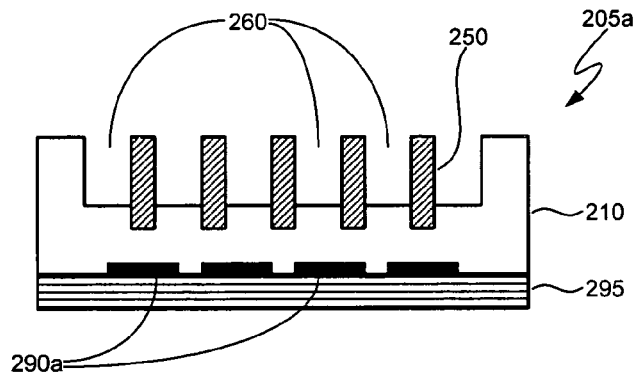

Returning now to FIG. 1, the substrate may be cut into individual die, as set forth in block 160. This is illustrated in FIG. 2H, which shows die 205a after singulation from the remainder of substrate 210. The die 205a includes a pattern of channels 260 that may form part of a fluid cooling system for the die. Again, as noted above, although just two die are shown in FIGS. 2A-2G for ease of illustration, the substrate 210 may include circuitry (and channels 260) for any desired number of die (e.g., several hundred).

Figure 2I:
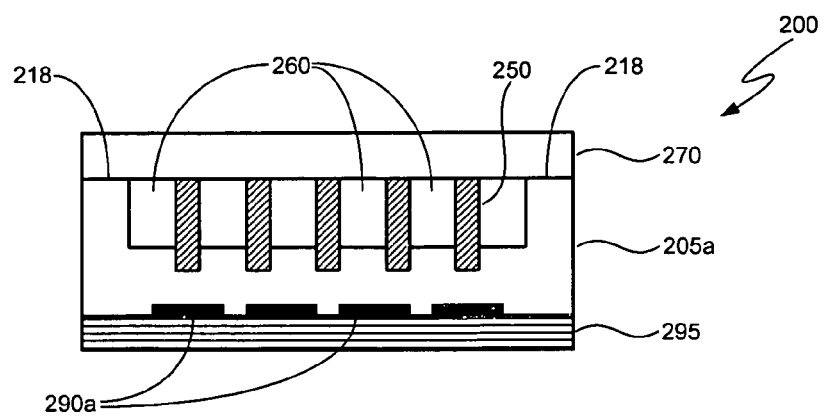

As set forth in block 170 of FIG. 1, a lid may be attached to the die. This is illustrated in FIG. 2I, which shows a lid 270 that has been attached to die 205a to form an integrated circuit device 200. The lid 270 is disposed over the channels 260 (and substrate 210 of die 205a) to form an enclosed fluid path. The lid may comprise any material—and have any suitable shape and configuration—that is capable of forming a seal with the upper ends of the diamond structures 250 (and upward extending portions 218 of the die substrate 210). Examples of materials which may be used to construct the lid 270 include diamond, silicon, glass, metal, ceramics, as well as others. The lid 270 may be attached to the die 205a using any suitable bonding technique. By way of example, the lid may be attached to the die using diffusion bonding, adhesive bonding, or by a solder reflow process.

In one embodiment, an integrated circuit device (e.g., device 200 of FIG. 2I) may be attached to a package substrate (or, alternatively, to a next-level component, such as a motherboard or other printed circuit board). This is illustrated, by way of example, in FIG. 6, which shows an apparatus 600. Apparatus 600 includes an integrated circuit (IC) device 200 having channels 260 formed according to any of the disclosed embodiments. The apparatus 600 further includes a package substrate (or other board) 610, and the IC device 200' is disposed on this substrate 610. The IC device 200 is electrically (and mechanically) coupled with a first side 611 the package substrate 610 by an array of interconnects 618 (e.g., conductive bumps or columns, etc.), which are bonded with a corresponding array of interconnects (e.g., conductive lands, pads, bumps, or columns, etc.) disposed on the substrate's first side 611. A layer of underfill material (not shown in figure) may also be disposed between the IC device 200 and substrate 610. The substrate 610 routes signal lines from interconnects 618 to an array of interconnects 619 (e.g., conductive bumps, columns, or pins, etc.) disposed on an opposing second side 612 of the substrate 610. The interconnects 619 may be used to electrically (and mechanically) couple the apparatus 600 to a next level component (e.g., a motherboard or other circuit board). In addition, the apparatus 600 may include a fluid inlet 683 and a fluid outlet 687 to couple the apparatus with a fluid cooling system, and an example of such a fluid cooling system is shown in FIG. 7 and described below. Parts of such a fluid cooling system may be disposed on portions of the package substrate 610 and/or on a next-level component (e.g., a motherboard or other board).

Figure 6:
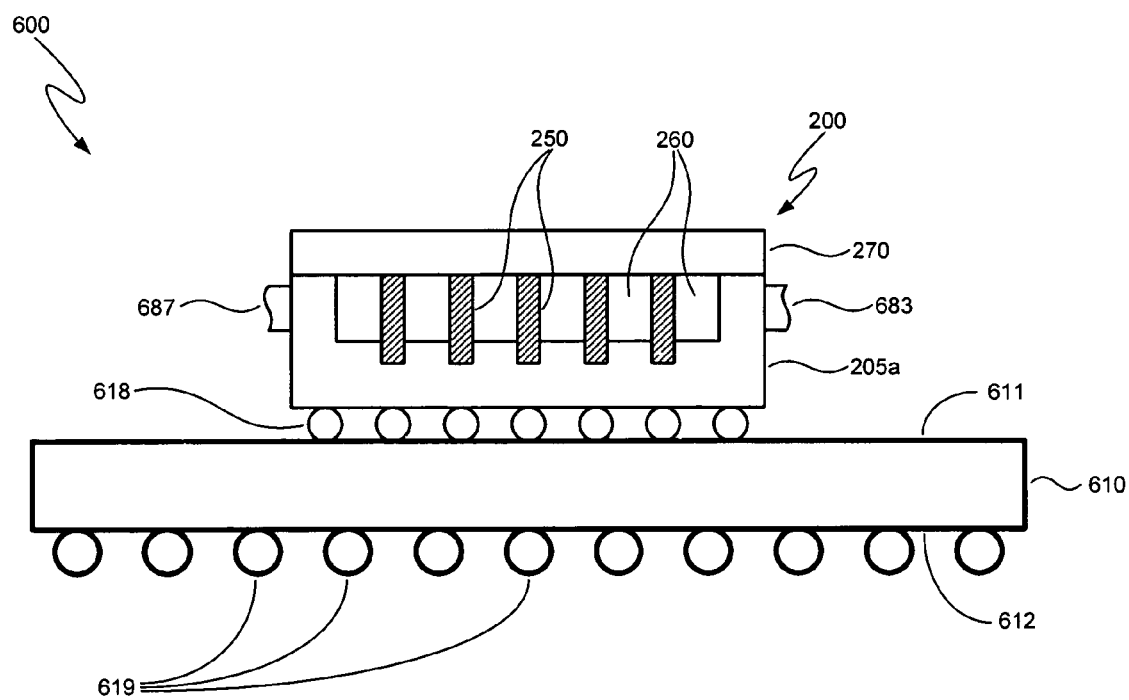
FIG. 6 is a schematic diagram illustrating an embodiment of an integrated circuit device including a diamond micro-channel structure.
Figure 7:
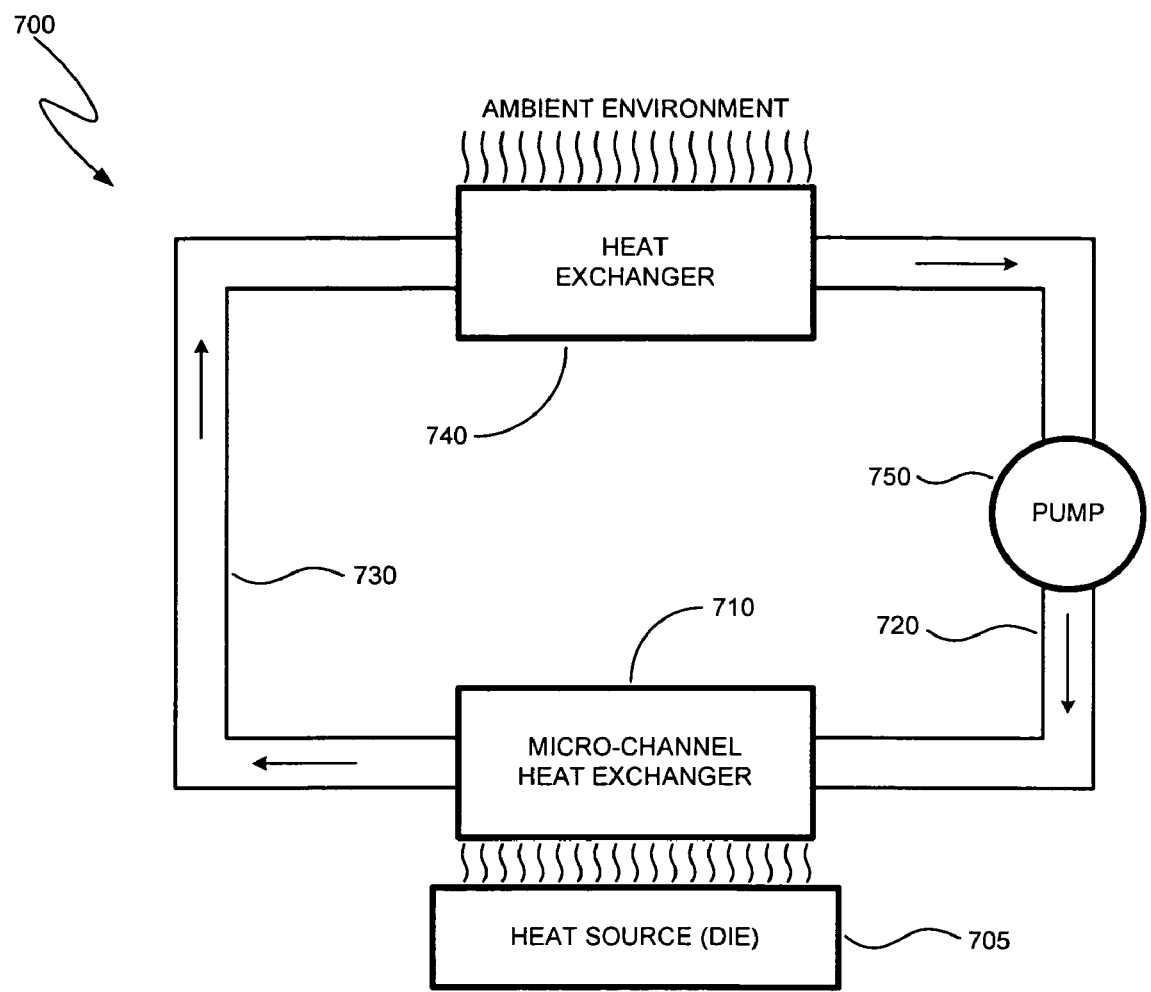
FIG. 7 is a schematic diagram illustrating an embodiment of a liquid cooling system.

Referring next to FIG. 7, illustrated is an embodiment of a fluid cooling system 700 for an integrated circuit device (e.g., the apparatus 600 of FIG. 6, or the device 200 of FIG. 2I). The fluid cooling system 700 includes a die 705 or other heat source, and this die is thermally coupled with a micro-channel heat exchanger 710. In one embodiment, the micro-channel heat exchanger 710 includes a number of channels disposed on the die and having walls comprised of diamond that are formed according to any of the embodiments described above. A fluid supply line 720 is coupled to an inlet of the micro-channel heat exchanger 710, whereas a fluid return line 730 is coupled to an outlet of the micro-channel heat exchanger. The return line 730 is coupled to the inlet of another heat exchanger 740, and this heat exchanger includes an outlet coupled with the supply line 720. The cooling system 700 further includes a pump 750 disposed in the supply line 720 (or at some other location, such as the return line 730) to circulate a cooling fluid through the cooling system (the direction of bulk fluid motion being generally denoted by arrows).

In one embodiment, the micro-channel heat exchanger 710, fluid supply line 720, fluid return line 730, heat exchanger 740, and pump 750 form a closed-loop fluid cooling system. Under pressure created by pump 750, a cooling fluid is caused to flow into micro-channel heat exchanger 710. In micro-channel heat exchanger 710, the cooling fluid receives heat generated by the die 705, thereby cooling the die. The heated fluid then flows through return line 730 to heat exchanger 740, which exhausts heat from the fluid to the ambient environment, thereby cooling the fluid. The cooled fluid is then fed back to the supply line 720 and is returned to the micro-channel heat exchanger 710. In one embodiment, at least some (or perhaps all) of the components of the fluid cooling system 700—e.g., the fluid supply and return lines 720, 730, the heat exchanger 740, and the pump 750—may be disposed on the same board (or other substrate or component) as the die 705 and micro-channel heat exchanger 710. As the reader will appreciate, the above-described fluid cooling system 700 is but one example a fluid cooling system and, further, that the disclosed embodiments may find application in other types of cooling systems.

Figure 8:
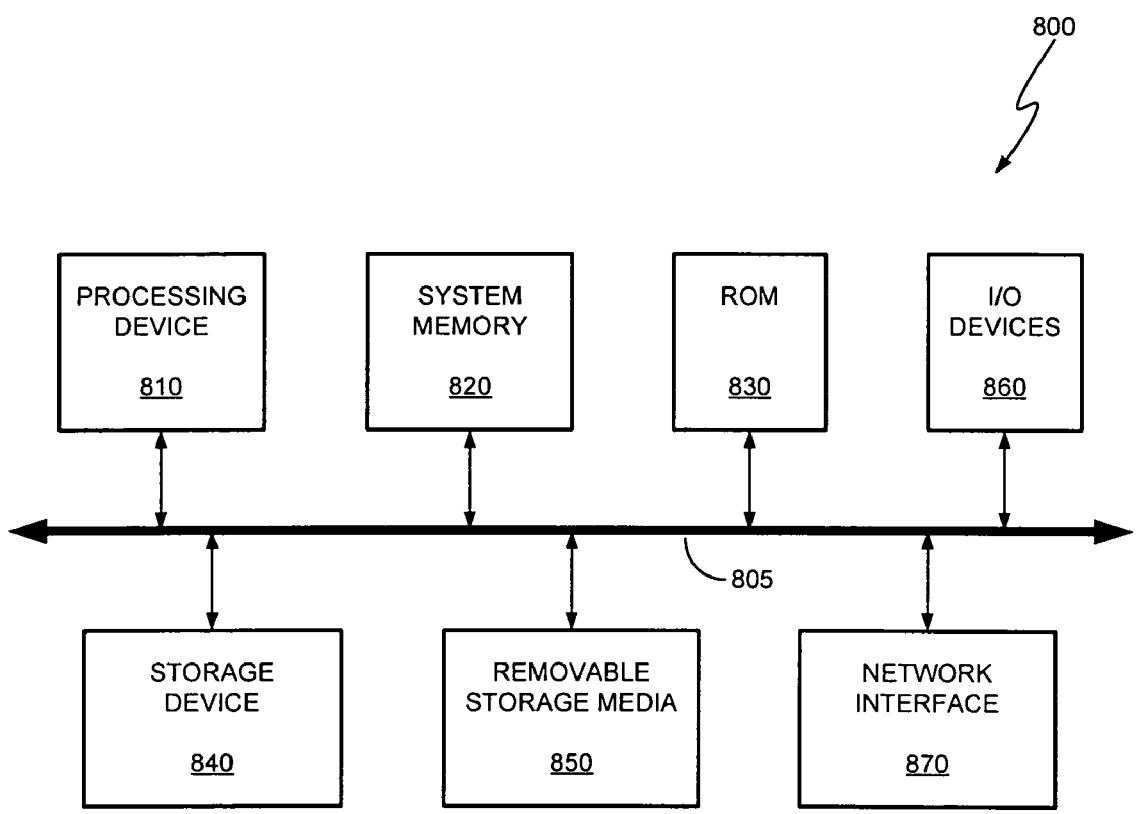
FIG. 8 is a schematic diagram illustrating an embodiment of a computer system, which may include a component formed according to the disclosed embodiments.

Referring to FIG. 8, illustrated is an embodiment of a computer system 800. Computer system 800 includes a bus 805 to which various components are coupled. Bus 805 is intended to represent a collection of one or more buses—e.g., a system bus, a Peripheral Component Interface (PCI) bus, a Small Computer System Interface (SCSI) bus, etc.—that interconnect the components of system 800. Representation of these buses as a single bus 805 is provided for ease of understanding, and it should be understood that the system 800 is not so limited. Those of ordinary skill in the art will appreciate that the computer system 800 may have any suitable bus architecture and may include any number and combination of buses.

Coupled with bus 805 is a processing device (or devices) 810. The processing device 810 may comprise any suitable processing device or system, including a microprocessor (e.g., either a single core or a multi-core processor), a network processor, an application specific integrated circuit (ASIC), or a field programmable gate array (FPGA), or similar device. It should be understood that, although FIG. 8 shows a single processing device 810, the computer system 800 may include two or more processing devices.

Computer system 800 also includes system memory 820 coupled with bus 805, the system memory comprising, for example, any suitable type and number of memories, such as static random access memory (SRAM), dynamic random access memory (DRAM), synchronous DRAM (SDRAM), or double data rate DRAM (DDRDRAM). During operation of computer system 800, an operating system and other applications may be resident in the system memory 820.

The computer system 800 may further include a read-only memory (ROM) 830 coupled with the bus 805. The ROM 830 may store instructions for processing device 810. The system 800 may also include a storage device (or devices) 840 coupled with the bus 805. The storage device 840 comprises any suitable non-volatile memory, such as, for example, a hard disk drive. The operating system and other programs may be stored in the storage device 840. Further, a device 850 for accessing removable storage media (e.g., a floppy disk drive or a CD ROM drive) may be coupled with bus 805.

The computer system 800 may also include one or more I/O (Input/Output) devices 860 coupled with the bus 805. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 800.

The computer system 800 may further comprise a network interface 870 coupled with bus 805. The network interface 870 comprises any suitable hardware, software, or combination of hardware and software that is capable of coupling the system 800 with a network (e.g., a network interface card). The network interface 870 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 800 illustrated in FIG. 8 is intended to represent an exemplary embodiment of such a system and, further, that this system may include many additional components, which have been omitted for clarity and ease of understanding. By way of example, the system 800 may include a DMA (direct memory access) controller, a chip set associated with the processing device 810, additional memory (e.g., a cache memory), as well as additional signal lines and buses. Also, it should be understood that the computer system 800 may not include all of the components shown in FIG. 8. The computer system 800 may comprise any type of computing device, such as a desktop computer, a laptop computer, a server, a hand-held computing device (e.g., a personal digital assistant, or PDA), a wireless communication device, an entertainment system, etc.

In one embodiment, the computer system 800 includes a component constructed according to any of the embodiments described above. For example, the processing device 810 of system 800 may include a die having channels with walls comprised of diamond, as described above. These channels may form part of a fluid cooling system for cooling the processing device 810. However, it should be understood that other components of system 800 (e.g., network interface 870, etc.) may include a device formed according to any of the disclosed embodiments.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A device comprising:
   a die comprised of silicon, the die having circuitry formed directly on a front side;
   a number of channels formed directly on an opposing back side of the die, wherein a wall of each of the channels is provided by one of a number of diamond structures; and
   a lid attached to the die, the lid overlying the channels.

2. The device of claim 1, wherein a wall of each of the channels is provided by the silicon die.

3. The device of claim 1, wherein the diamond structures are embedded in the silicon die.

4. The device of claim 1, wherein the number of channels comprises a pattern including an inlet fluid reservoir and an outlet fluid reservoir, wherein at least one of the number of channels extends between the inlet and outlet fluid reservoirs.

5. The device of claim 1, wherein at least one of the number of channels traverses a hot spot on the die.

6. A device comprising:
   a die comprised of a semiconductor material, the die having circuitry formed directly on a front side;

a number of channels formed directly on an opposing back side of the die, wherein a wall of each of the channels is provided by one of a number of structures comprised of a second material, the second material comprising a diamond material or a diamond-like material; and a lid attached to the die, the lid overlying the channels.

7. The device of claim 6, wherein a wall of each of the channels is provided by the semiconductor die.

8. The device of claim 6, wherein the structures are embedded in the semiconductor die.

9. The device of claim 6, wherein the number of channels comprises a pattern including an inlet fluid reservoir and an outlet fluid reservoir, wherein at least one of the number of channels extends between the inlet and outlet fluid reservoirs.

10. The device of claim 6, wherein at least one of the number of channels traverses a hot spot on the die.

11. The device of claim 6, wherein the second material comprises diamond-like carbon.

12. The device of claim 6, wherein the semiconductor material comprises at least one material selected from a group consisting of silicon, silicon-on-insulator, and gallium arsenide.

* * * * *